United States Patent
Pawlis et al.

(10) Patent No.: US 12,243,917 B2
(45) Date of Patent: Mar. 4, 2025

(54) PRODUCING AN OHMIC CONTACT AND ELECTRONIC COMPONENT WITH OHMIC CONTACT

(71) Applicant: Forschungszentrum Jülich GmbH, Jülich (DE)

(72) Inventors: Alexander Pawlis, Alsdorf (DE); Johanna Janßen, Aachen (DE); Benjamin Bennemann, Jülich (DE); Christoph Krause, Jülich (DE)

(73) Assignee: Forschungszentrum Jülich GmbH (DE)

( * ) Notice: Subject to any disclaimer, the term of this patent is extended or adjusted under 35 U.S.C. 154(b) by 593 days.

(21) Appl. No.: 17/603,612

(22) PCT Filed: Apr. 2, 2020

(86) PCT No.: PCT/EP2020/059394
§ 371 (c)(1),
(2) Date: Oct. 14, 2021

(87) PCT Pub. No.: WO2020/212154
PCT Pub. Date: Oct. 22, 2020

(65) Prior Publication Data
US 2022/0216306 A1  Jul. 7, 2022

(30) Foreign Application Priority Data
Apr. 15, 2019  (DE) .................. 102019205376.9

(51) Int. Cl.
*H01L 21/02* (2006.01)
*H01L 21/285* (2006.01)
(Continued)

(52) U.S. Cl.
CPC ...... *H01L 29/267* (2013.01); *H01L 21/02477* (2013.01); *H01L 21/02557* (2013.01);
(Continued)

(58) Field of Classification Search
CPC ......... H01L 21/02052; H01L 21/02101; H01L 21/02054; H01L 21/02068–02074;
(Continued)

(56) References Cited

U.S. PATENT DOCUMENTS

| | | | | |
|---|---|---|---|---|
| 4,719,155 A | * | 1/1988 | Matsumoto | H01L 21/02557 257/191 |
| 5,213,998 A | * | 5/1993 | Qiu | H01S 5/347 148/DIG. 95 |

(Continued)

FOREIGN PATENT DOCUMENTS

| | | |
|---|---|---|
| DE | 69220942 T2 | 3/1998 |
| DE | 69613502 T2 | 11/2001 |

(Continued)

OTHER PUBLICATIONS

Janssen et al., "Low-Temperature Ohmic Contacts to n-ZnSe for all-Electrical Quantum Devices," ACS Applied Electronic Materials, 2020, 2, pp. 898-905.

(Continued)

*Primary Examiner* — Eric A. Ward
*Assistant Examiner* — Nora T. Nix
(74) *Attorney, Agent, or Firm* — Dickinson Wright PLLC

(57) ABSTRACT

A method for producing an ohmic contact for an electronic part, wherein a layer consisting of a semiconductor is applied to a substrate is disclosed. A surface to be contacted of the applied semiconductor is wet-chemically etched, which is rinsed with radicals. An electrical conductor or a semiconductor is applied to the surface rinsed with radicals. An electronic component having several semiconductor layers on a substrate is also disclosed. A top layer on the one or more semiconductor layers is applied to the substrate. The top layer consists of an electrically non-conductive dielectric having an access through the top layer to a semiconductor (Continued)

Figure 1:
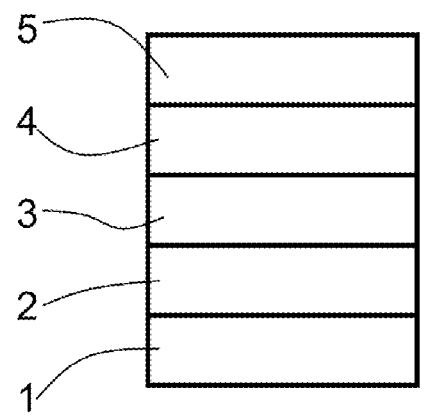

layer, wherein adjacent semiconductor layers consist of different II-VI semiconductors. The access is at least partially filled with a II-VI semiconductor. A metallic contact applied to the II-VI semiconductor extends to the outer side of the top layer or projects outwardly relative to the top layer.

12 Claims, 4 Drawing Sheets

(51) Int. Cl.
  *H01L 21/443* (2006.01)
  *H01L 29/267* (2006.01)
(52) U.S. Cl.
  CPC .... *H01L 21/0256* (2013.01); *H01L 21/02568* (2013.01); *H01L 21/02642* (2013.01); *H01L 21/28575* (2013.01); *H01L 21/443* (2013.01)
(58) Field of Classification Search
  CPC ............. H01L 21/02087; H01L 21/043; H01L 21/0485; H01L 29/45–458; H01L 21/02477; H01L 21/0256; H01L 21/8234–8249; H01L 29/66477–6684; H01L 29/78–7926; H01L 29/1033–1054; H01L 21/441–445; H01L 21/38–388; C23C 14/021–022; B08B 3/00–14; H10K 10/84
  See application file for complete search history.

(56) References Cited

U.S. PATENT DOCUMENTS

| | | | | |
|---|---|---|---|---|
| 5,215,929 | A * | 6/1993 | Okawa | H01L 33/24 438/494 |
| 5,544,190 | A * | 8/1996 | Mensz | H01S 5/327 372/45.01 |
| 5,818,072 | A | 10/1998 | Schetzina | |
| 5,879,962 | A * | 3/1999 | DePuydt | H01L 21/02576 257/E21.462 |
| 2001/0055887 | A1 | 12/2001 | Nakamura | |
| 2002/0094699 | A1* | 7/2002 | Houng | H01L 21/28264 257/E21.228 |
| 2004/0219789 | A1* | 11/2004 | Wood | H01L 21/31116 257/E21.252 |
| 2006/0060921 | A1* | 3/2006 | Takizawa | H01L 29/78654 257/E21.415 |
| 2009/0206354 | A1* | 8/2009 | Kitano | H01L 33/387 257/98 |
| 2014/0342491 | A1* | 11/2014 | Masuyama | G02B 6/131 438/69 |
| 2017/0148638 | A1* | 5/2017 | Loup | H01L 21/32134 |
| 2018/0096885 | A1 | 4/2018 | Chan et al. | |
| 2020/0313036 | A1* | 10/2020 | Broell | H01L 33/32 |

FOREIGN PATENT DOCUMENTS

| | | |
|---|---|---|
| EP | 0674347 A1 | 9/1995 |
| EP | 0766297 A2 | 4/1997 |
| EP | 1150360 A2 | 10/2001 |
| JP | H09055365 | 2/1997 |

OTHER PUBLICATIONS

Hanson et al., "Spins in few-electron quantum dots," Arxiv.org, Cornell University Library, 201 Olin Library Cornell University Ithava, NY 14853, Oct. 16, 2006, XP080256043, pp. 1-52.

Hughes et al., "Surface preparation of ZnSe subtrates for MBE growth of II-VI light emitters," Journal of Crystal Growth 175/176 (1997), pp. 546-551.

International Search Report with English Translation for PCT Application No. PCT/EP2020/059394, dated Aug. 3, 2020, pp. 1-7.

* cited by examiner

PRODUCING AN OHMIC CONTACT AND ELECTRONIC COMPONENT WITH OHMIC CONTACT

CROSS-REFERENCE TO RELATED APPLICATIONS

The present application is a national phase application of International Patent Application No. PCT/EP2020/059394, filed on Apr. 2, 2020, which claims priority to German Patent Application No. 102019205376.9, filed on Apr. 15, 2019, entitled "PRODUCING AN OHMIC CONTACT AND ELECTRONIC COMPONENT WITH OHMIC CONTACT," the disclosures of which are hereby incorporated by reference in their entireties.

The invention relates to a method for producing an ohmic contact at an electronic component. The invention relates to an electronic component having an ohmic contact for a buried semiconductor.

An ohmic contact is a junction between a metal and a semiconductor with a small electrical resistance.

A buried semiconductor is a semiconductor that is located inside an electronic component. It is usually a layer which consists of the semiconductor and is sandwiched between two other layers.

A local ohmic contact for the buried semiconductor is an electrical conductor consisting of metal or a semiconductor of the ohmic contact that is passed through a hole of the electronic component and contacts the buried semiconductor.

To produce an electronic component, one or more layers can be applied to (deposited on) a substrate. The one or more layers may consist of semiconductors. One or more of these applied semiconductor layers may consist of doped semiconductors, and in particular n-doped semiconductors. Semiconductors may be doped with chlorine or iodine, for example. Doping with fluorine is also possible, but in principle less suitable compared to chlorine and iodine. A p-doping is also possible, but in many cases less suitable. An electrically insulating top layer may be applied to the one or more semiconductor layers applied to the substrate. The one or more semiconductor layers are then buried semiconductor layers in the sense of the present invention. To produce an ohmic contact for a buried semiconductor layer, a hole may be created which leads through the top layer to the buried semiconductor layer. The hole can be produced by etching. Following the creation of a hole, it can be filled with a metal to create a local ohmic contact that can be electrically contacted above the top layer. It is thus possible, for example, to subsequently equip an electronic component with additional gate electrodes required for unipolar components such as field-effect transistors or electron-spin qubits.

In electronic components comprising substrates and/or layers of GaAs and AlGaAs or of Si and SiGe, metals can be thermally alloyed into a created hole of a top layer at high temperatures to contact a buried semiconductor and create a local ohmic contact. Additional dopants can be locally introduced prior to alloying in a metal by ion implantation to create suitably good ohmic contacts.

The known methods for producing a local ohmic contact are not suitable for all compound semiconductors. For example, the II-VI compound semiconductor ZnSe does not tolerate high temperatures, which is required for efficient alloying in of a metal. Ion implantation can severely damage the crystal structure of such compound semiconductors, greatly reducing conductivity. The production of a junction between a metal and a semiconductor with a small electrical resistance is then not possible in this way. The problem occurs mainly with II-VI compound semiconductors. However, III-V compound semiconductors can also be affected by the problem.

It may be of interest to be able to operate electronic components at low temperatures. This may be necessary, for example, for electron-spin qubits of a quantum computer.

It is the task of the invention to be able to produce an ohmic contact at an electronic component, in particular a local ohmic contact for buried III-V compound semiconductors or II-VI compound semiconductors of an electronic component. Preferably, this should also be possible for II-VI compound semiconductors that can be doped with chlorine. The ohmic contact should preferably also enable operation of the associated electronic component at low temperatures.

The task of the invention is solved by a method with the features of claim 1 and an electronic component with the features of the additional claim. Advantageous embodiments result from the dependent claims.

To solve the task, a method is provided for producing an ohmic contact for an electronic part. In order to produce the electronic part, a layer consisting of a semiconductor, i.e. a semiconductor layer, is indirectly or directly applied to a substrate. If the semiconductor layer has been directly applied on the substrate, there is no other layer between the semiconductor layer and the substrate. If the semiconductor layer has been indirectly applied to the substrate, there are one or more layers between the substrate and the semiconductor layer.

A surface to be contacted of the semiconductor is wet-chemically etched. The wet-chemically etched surface is rinsed with radicals. An electrical conductor or a semiconductor is applied to the surface rinsed with radicals. In this way, it is possible to produce a connection to a semiconductor that can easily be damaged by usual production processes in such a way that the creation of a junction with a small electrical resistance is not possible. Surprisingly, it has been found that such problems can be solved by chemical etching and subsequent rinsing with radicals, even if the surface has previously been processed in a damaging manner such as ion etching.

A radical is an atom or a molecule with at least one unpaired valence electron. Rinsing with hydrogen radicals has proven to be effective. These have proven to be suitably reactive.

Wet-chemical etching and subsequent rinsing with radicals have proven to be decisive steps in order to contact sensitive II-VI as well as III-V compound semiconductors in such a way that almost perfectly linear current-voltage characteristics and extremely low contact resistances can be achieved at room temperature and at very low temperatures.

Preferably, rinsing is carried out in the absence of oxygen. Preferably, rinsing is carried out in an ultra-high vacuum and thus also in the absence of oxygen in order to obtain a further improved result. This embodiment is particularly advantageous for compound semiconductors that can oxidize rapidly in air. ZnSe is an example of a compound semiconductor that can oxidize rapidly in air. Through oxidation, an electrically non-conductive surface oxide layer can be formed that forms a barrier to current transport. A junction with a small electrical resistance can thus be prevented.

The result can be further improved by rinsing at an increased temperature, for example 100° C. to 200° C.

Rinsing is preferably performed for several minutes, for example 2-10 minutes, to achieve desired results.

In wet-chemical etching, chemical bonds of the material to be processed are broken by etching media and converted into soluble components. The etching media regularly used are $K_2Cr_2O_7+HBr+H_2O$ or $NH_3+H_2O_2+H_2O$ or $K_2Cr_2O_7+H_2SO_4+H_2O$.

Preferably, wet-chemical etching is carried out for a few seconds, such as 2-10 seconds, in order to be able to contact the compound semiconductor in a suitable manner.

The semiconductor, which is prepared for producing an ohmic contact by wet-chemical etching and subsequent rinsing with radicals, may be a II-VI compound semiconductor or a III-V compound semiconductor. II-VI compound semiconductors, which can be doped with chlorine, benefit most from the advantages of the method. Examples of such II-VI compound semiconductors are (Zn,Mg)Se, (Zn,Cd)Se, (Zn,Mg)SSe, (ZnCd)SSe, ZnSe,CdSe or ZnSSe.

The metal of the compound semiconductor is preferably selected from zinc (Zn), cadmium (Cd), magnesium (Mg) and/or beryllium (Be). The non-metal of the compound semiconductor is preferably selected from selenium (Se) and/or sulfur (S).

To produce an ohmic contact for a buried semiconductor, a producing method may comprise the following steps:
applying one or more semiconductor layers to a substrate;
applying an electrically non-conductive top layer to the one or more applied semiconductor layers, wherein the top layer may consist of an electrically non-conductive dielectric;
creating a hole through the top layer to a semiconductor layer;
this surface of the semiconductor layer accessible through the hole is wet-chemically etched as previously described,
this wet-chemically etched surface is rinsed with radicals as previously described,
a doped semiconductor is applied to this surface rinsed with the radicals, and
a metal, for example aluminum, is applied to the applied doped semiconductor.

An electronic part produced in this way can be subsequently equipped with a gate electrode, for example.

The hole created in the top layer, which passes through the top layer, may have been partially or completely filled with the doped semiconductor. The hole created in the top layer may have passed through one or more further layers below the top layer to reach the desired semiconductor layer. One or more of the further layers may be semiconductor layers, i.e. consist of a semiconductor.

A plurality of holes can be created in a top layer to produce a plurality of local ohmic contacts.

The filling of the holes with a doped semiconductor is preferably performed by molecular beam epitaxy. This enables selective growth. The growth can thus be limited to the region of holes. Such an application by molecular beam epitaxy is known under the designation regrowth process. Producing is simplified by such a process. An additional step, namely the etching away of doped semiconductor between a plurality of holes, is omitted. However, this does not exclude that in one embodiment of the invention a later applied metal layer between holes or between produced ohmic contacts is etched away. Advantageously, a subsequently applied metal layer between holes or between produced ohmic contacts is etched away in such a way that in this step then also one or more additional gate electrodes are generated independently of the ohmic contacts.

For producing an electronic part, which may be a unipolar part (component) in the finished state and which can also be used at low temperatures, one or more semiconductor layers can be applied to the substrate in an ultra-high vacuum. Subsequently, the top layer can be applied to the one or more semiconductor layers deposited in the ultra-high vacuum. During the application process, surfaces of layers are not exposed to the atmosphere in this configuration and, consequently, neither is the surface to which the top layer is applied.

Adjacent semiconductor layers consist of different semiconductor materials and/or are at least doped differently.

Thus, for example, a first semiconductor layer may be applied to the substrate. Subsequently, a second semiconductor layer may be applied to the first semiconductor layer. Subsequently, a third semiconductor layer may be applied to the second semiconductor layer. Subsequently, a top layer may be applied to the third semiconductor layer. However, more than three semiconductor layers may be applied before a top layer is applied.

The first and/or the third applied semiconductor layer may consist of (Zn,Mg)Se, (Zn,Cd)Se, Zn(S,Se) or (Zn,Mg)(S,Se). The second layer may consist of ZnSe or CdSe. These materials are particularly suitable for producing a unipolar part that can also be used at low temperatures to serve as qubits in a quantum computer. The second layer may have been produced as a doped layer. However, this is not necessary.

The top layer may consist of an oxide ceramic. For example, the top layer consists of aluminum oxide, silicon oxide or hafnium oxide. However, the top layer may also consist of another material such as silicon nitride. These materials can serve as an optimal gate dielectric for producing unipolar components such as 2D or 3D field effect transistors or electrostatically defined electron-spin qubits. The invention therefore also relates to unipolar components of this type.

In general, an electrically non-conductive dielectric is suitable as a top layer material for producing unipolar components.

The substrate may consist of a semiconductor. The substrate may consist of a III-V semiconductor or a II-VI compound semiconductor to enable II-VI semiconductor layers to be suitably produced on the substrate. Thus, the substrate may consist of GaAs, ZnSe, (In,Ga)As, InAs, (In,Ga)P, (In,Ga,Al)P, InAs, or InP.

A hole passing through the top layer can be created by wet-chemical etching, in particular with HF. Alternatively, the hole can be created by reactive ion etching, especially with $CHF_3+O_2$.

If the hole is to be continued into underlying layers, this can be done by reactive ion etching. This can be done in general by means of $Cl_2+Ar$, $Cl_2+BCl_3$ or $CH_4+H_2+Ar$, for example in the case of compound semiconductors consisting of (Zn,Mg)Se, Zn(S,Se), CdSe or ZnSe.

Dry etching processes can severely damage the crystal structure of compound semiconductors near the surface. However, the resulting problems can be eliminated by subsequent chemical wet etching and rinsing with radicals, so that it is still possible to produce junctions with small electrical resistances. Rinsing is carried out in the absence of oxygen in particular in cases where the corresponding semiconductor can oxidize easily.

To produce a hole which passes through the top layer by etching, an etch mask can be applied to the top layer. The top layer may consist of a photoresist, wherein the resist is provided with a hole. The resist with a hole may have been produced by optical lithography.

After producing a hole which passes through the top layer by etching to the desired depth, the surface to be contacted of the applied semiconductor can be wet-chemically etched as previously described.

After this final etching, the etching mask can be removed. For technical reasons, cleaning is now advisable, for example with a solvent such as isopropanol. In particular, the surface to be contacted of the applied semiconductor should then be cleaned, i.e. the semiconductor layer which is provided for ohmic contact.

To further improve the desired technical result, it is advantageous to thermally treat the component after etching and preferably also after cleaning. This may be done at a temperature which may be between 100° C. and 200° C. The thermal treatment can last for several minutes, for example at least 15 minutes. After 60 minutes at the latest, the thermal treatment can be terminated, since then, usually, no more advantageous effect can be achieved. A treatment time of about 30 minutes, for example, is therefore sufficient.

In order to obtain a further improved technical result, the thermal treatment is preferably carried out in an ultra-high vacuum. In this way, disadvantageous environmental influences can be suitably avoided.

Following the thermal treatment, rinsing with radicals, in particular hydrogen radicals, can be carried out, preferably for several minutes. This is preferably done in an ultra-high vacuum, particularly preferably in the ultra-high vacuum that has been provided for the thermal treatment. In particular, it is thus avoided that the part to be produced comes into contact with the atmosphere after the thermal treatment and before the rinsing with radicals.

Advantageously, after rinsing with radicals, the surface to be contacted of the semiconductor layer is processed with a metal vapor. The metal vapor includes a metal that is also present in the semiconductor. Thus, if the semiconductor consists of ZnSe, for example, the metal vapor includes zinc as the metal. The metal vapor is therefore generated by a zinc source in the case of ZnSe. Metal is thermally vaporized by such a metal source. Possibly existing metal defects can thus be filled, which can lead to a further improved desired technical result. The processing with the metal vapor is preferably done in an ultra-high vacuum, preferably in the ultra-high vacuum already provided for previous steps. As before, contact with the atmosphere is then prevented.

Finally, the hole can be filled completely or partially with a semiconductor and, in principle, with a semiconductor that matches the semiconductor that is to be contacted. For example, if a layer consisting of ZnSe is to be contacted, the hole is preferably filled completely or partially with ZnSe. However, the two semiconductors may differ in their doping. Thus, the hole can be filled with n-doped ZnSe completely or partially to contact a layer that has been produced from undoped ZnSe.

The hole is preferably filled with the semiconductor at a temperature which is particularly suitable for growth, for example 200-400° C. For example, a temperature of 300° C. is suitable for ZnSe. The filling of the hole is done in an ultra-high vacuum, preferably still in the ultra-high vacuum already provided for previous steps to further prevent contact with the atmosphere.

Once the hole has been completely or partially filled with a semiconductor, metal is finally applied to this semiconductor. This is done, for example, by means of a vapor deposition system for metal. Preferably, this is done again consistently in the aforementioned ultra-high vacuum, so that contact with the atmosphere is consistently prevented. The semiconductor produced by regrowth, for example, cannot therefore oxidize before metal has been deposited.

Aluminum is particularly suitable as a metal. Titanium or magnesium are also well suited.

To enable the latter steps to be carried out in situ in an ultra-high vacuum, the equipment required for this is coupled to one another by the ultra-high vacuum. Thus, there is a chamber in which an ultra-high vacuum can be generated. This chamber comprises a molecular beam epitaxy system for compound semiconductors, an evaporation system for metal, for example for aluminum, an atomic layer deposition system and a radical source, for example for hydrogen radicals.

Comparative tests have shown that, in the case of sensitive compound semiconductors, an ohmic contact with considerably better properties can be provided in this way compared with the known state of the art.

The invention also relates to an electronic component that can be produced according to the method, having a plurality of semiconductor layers on a substrate, a top layer on the one or more semiconductor layers applied to the substrate, wherein the top layer consists of an electrically non-conductive dielectric. Adjacent semiconductor layers consist of different II-VI semiconductors, so that a heterojunction exists. Due to a created hole, there is an access leading through the top layer to a semiconductor layer. The access is at least partially filled with a II-VI semiconductor. A metallic contact is applied to the II-VI semiconductor. This fills the access at least completely, so that it extends at least to the outer side of the top layer. Usually, the metallic contact protrudes outwardly relative to the top layer. The metallic contact consists in particular of aluminum.

The first and/or the third semiconductor layer applied preferably consists of (Zn,Mg)Se, Zn(S,Se), (Zn,Cd)Se or (Zn,Mg)(S,Se). In particular, the second semiconductor layer consists of ZnSe or CdSe. The top layer preferably consists of aluminum oxide, silicon oxide, hafnium oxide or silicon nitride. The substrate may consist of GaAs, ZnSe, AlAs, InAs, GaP, AlP or InP or of mixed forms such as (In,Ga)As or (In,Al)GaP.

The invention further relates to a unipolar component, which may be constructed as previously described. The unipolar component may be a field effect transistor or a high mobility transistor. It may be an electron-spin qubit component.

The invention is explained in more detail below by means of an example.

Figure 2:
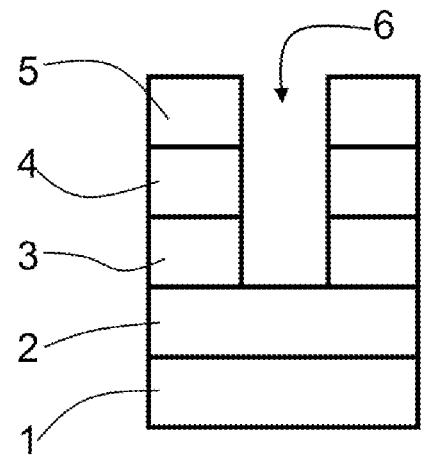
Figure 3:
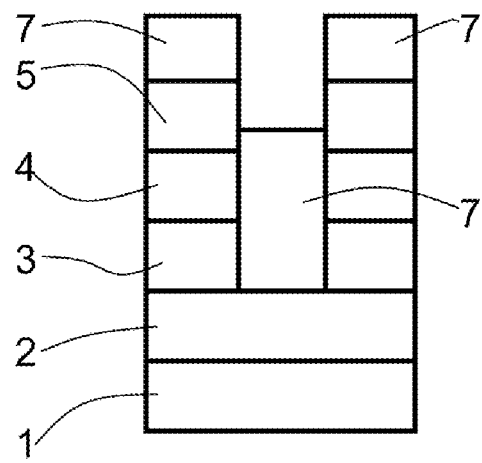
Figure 4:
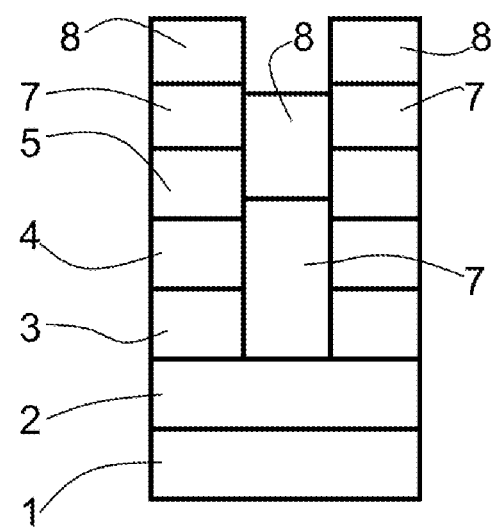
Figure 5:
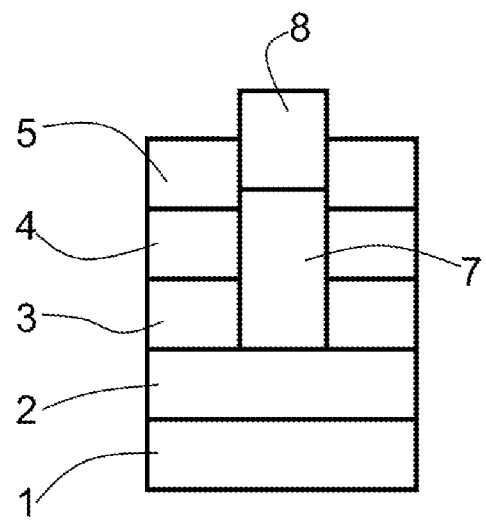
Figure 6:
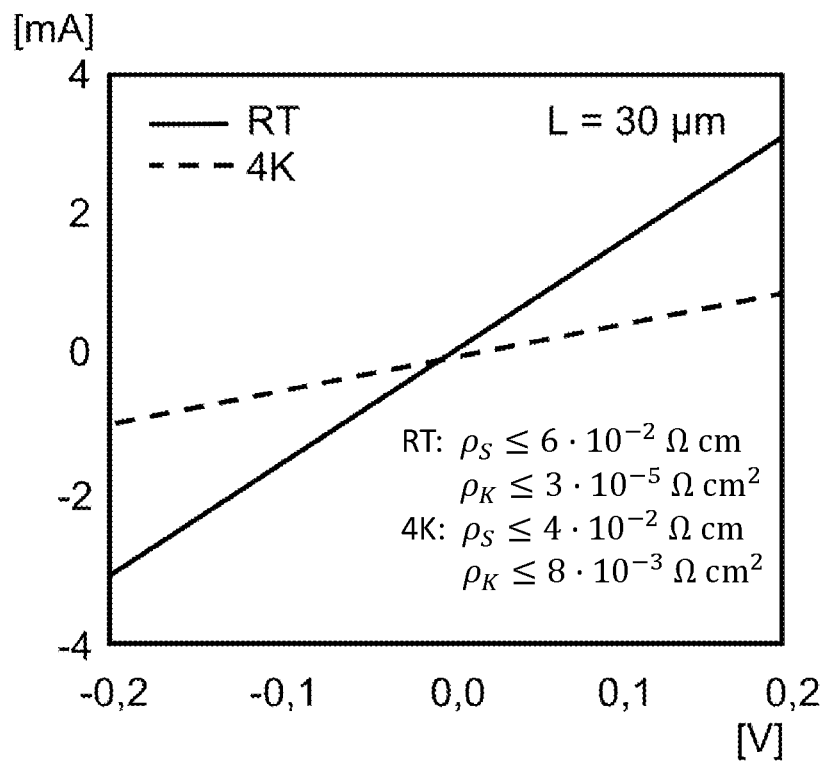
Figure 7:
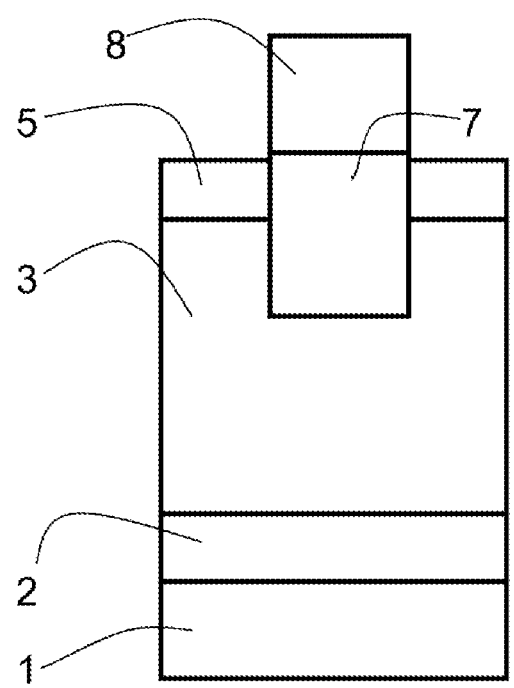

The figures show:

FIG. 1: Layer structure with a ZnSe layer;

FIG. 2: Layer structure with hole;

FIG. 3: Layer structure with hole partially filled with semiconductor;

FIG. 4: Layer structure with applied aluminum;

FIG. 5: Layer structure with finished local ohmic contact;

FIG. 6: measured current-voltage characteristics;

FIG. 7: further structure for an electronic component with buried semiconductor layers and local ohmic contact.

FIG. 1 shows a substrate 1 of gallium arsenide on which a buried first semiconductor layer 2 of (Zn,Mg)Se has been deposited in an ultra-high vacuum. On the first semiconductor layer 2, a buried second semiconductor layer 3 of ZnSe has been deposited in situ in the ultra-high vacuum. On the second semiconductor layer 3, a buried third semiconductor layer 4 of (Zn,Mg)Se has been deposited in situ in the ultra-high vacuum. On the third semiconductor layer 4, a top layer 5 of $Al_2O_3$ has been deposited in situ in the ultra-high vacuum. The deposition is done for example by atomic layer deposition. The layers can be several 10 nanometers thick, for example 20 nm thick.

In situ means that the structure produced in FIG. 1 was not removed from the ultra-high vacuum during its producing, so that no detrimental oxidation effects could occur.

After deposition of the $Al_2O_3$ layer, the structure is removed from the ultra-high vacuum. By means of conventional optical lithography, a reticular mask with holes is defined in a previously applied photoresist, in which the ohmic contacts will later be created by regrowth. At the positions of the holes, the $Al_2O_3$ layer 5 is first opened either wet-chemically with HF or by reactive ion etching with $CHF_3+O_2$. Then the underlying (Zn,Mg)Se and ZnSe layers 4 and 3 are opened by reactive ion etching with $Cl_2+Ar$. Thus, etching down is performed, as shown in FIG. 2, to create a hole 6. The semiconductor layer 3 can be contacted through this hole 6.

After reactive ion etching, the resulting radiation damage is removed by wet-chemical re-etching for about 5 seconds with a solution of $K_2Cr_2O_7+HBr+H_2O$. Then the photoresist is removed and the etched ZnSe semiconductor layer 3 is cleaned with isopropanol and reintroduced into the ultra-high vacuum for the regrowth process. Afterwards, the structure is heated up to 150° C. for 30 minutes in the ultra-high vacuum and then rinsed with hydrogen radicals for 5 minutes. In this way, chemical residues from the etching and cleaning process as well as possible oxide residues on the surface are removed. The etched layer is then slowly heated under zinc flux to the growth temperature suitable for the regrowth process of 300° C. This serves to fill possibly remaining zinc defects near the etched surface. This is followed by the growth of a chlorine-doped ZnSe layer 7 by molecular-beam epitaxy (MBE) under standard growth parameters. This is shown in FIG. 3. The layer 7 should be at least thick enough to fill the hole up to the $Al_2O_3$ layer 5. Otherwise, the metal 8 on the layer 7 would contact the layer 4 and thus the semiconductor (Zn,Mg)Se laterally. This could be disadvantageous and should therefore be avoided.

Subsequently, the newly grown doped ZnSe layer 7 is coated in situ with aluminum 8 as an ohmic contact material, which is shown in FIG. 4. The in situ deposited aluminum layer 8 prevents the formation of an oxide between the chlorine-doped ZnSe layer 7 and the aluminum layer 8, so that an unhindered current transport can take place through the aluminum-ZnSe interface.

In a final step, optical lithography and subsequent wet-chemical etching is used to remove the excess aluminum and ZnSe between the actual local contacts until the structure shown in FIG. 5 is achieved.

The layer thicknesses in FIG. 5 are only schematic. The two semiconductor layers 2 and 4 may be thicker than the semiconductor layer 3. The top layer 5 may be thinner than the semiconductor layer 3. Advantageously, the semiconductor layer 7 is at least thick enough to extend into the dielectric layer 5.

In this way, excellent local ohmic contacts with minimum contact resistance and a linear current-voltage characteristic at room temperature and low temperature can be realized. FIG. 6 shows a diagram with correspondingly linear current-voltage characteristics measured at room temperature RT (solid line) and 4 K (dashed line) with the structure shown in FIG. 7. The distance between two ohmic contacts of the part used for the measurement was 30 μm. The measured current in milliamperes is plotted against the applied voltage in volts. In addition to the excellent linearity of the current-voltage characteristics, the contact resistance and sheet resistance of the component shown in FIG. 7 can be determined from the measurement. At room temperature the contact resistance is $\rho_K \leq 3\times 10^{-5}$ $\Omega cm^2$ and the sheet resistance $\rho_S$ $6\times 10^{-2}$ $\Omega cm$, at low temperature the contact resistance is $\rho_K \leq 8\times 10^{-3}$ $\Omega cm^2$ and the sheet resistance $\rho_S \leq 4\times 10^{-2}$ $\Omega cm$.

The component shown in FIG. 7 comprises a substrate 1 of gallium arsenide. On the substrate there is a non-doped, approx. 20 nm thick ZnSe semiconductor layer 2. On the ZnSe semiconductor layer 2 there is an approx. 800 nm thick chlorine-doped ZnSe semiconductor layer 3. On the semiconductor layer 3 there is an approx. 20 nm thick dielectric layer 5 of $Al_2O_3$. An access created to the semiconductor layer 2 by means of a hole has been completely filled with chlorine-doped ZnSe, i.e. with ZnSe:Cl. Aluminum 8 with a thickness of approx. 120 nm is applied on this ZnSe:Cl filling 7.

The invention claimed is:

1. A method for producing an ohmic contact for an electronic part, wherein a layer consisting of a semiconductor is applied indirectly or directly to a substrate, wherein a surface to be contacted of the applied semiconductor is wet-chemically etched, the wet-chemically etched surface is rinsed with radicals, after rinsing with radicals, the surface to be contacted of the semiconductor layer is processed with a metal vapor, wherein the metal vapor includes a metal that is also present in the semiconductor so as to fill metal defects in the semiconductor with the corresponding metal from the metal vapor, and a semiconductor is applied to the surface processed with the metal vapor.

2. The method of claim 1, wherein rinsing is carried out with hydrogen radicals.

3. The method of claim 1, wherein rinsing is carried out in an ultra-high vacuum.

4. The method of claim 1, wherein rinsing is carried out at a temperature between 100° C. and 200° C.

5. The method of claim 1, wherein wet-chemical etching is carried out with K2Cr2O7+HBr+H2O or with NH3+H2O2+H2O or with K2Cr2O7+H2SO4+H2O.

6. The method of claim 1, wherein wet-chemical etching is carried out for 1 to 20 seconds.

7. The method of claim 1, wherein the semiconductor is a II-VI semiconductor or a III-V semiconductor and consists in particular of (Zn,Mg)Se, Zn(S,Se), ZnSe, CdSe or (Zn,Mg)(S,Se).

8. The method of claim 1, wherein the metal of the semiconductor is selected from zinc (Zn), cadmium (Cd), magnesium (Mg) and/or beryllium (Be).

9. The method of claim 1, wherein the non-metal of the semiconductor is selected from selenium (Se) and/or sulfur (S).

10. The method of claim 1, wherein the semiconductor is doped with chlorine (Cl) or can be doped with chlorine (Cl).

11. The method of claim 1, where a metallic contact is applied to the semiconductor applied to the surface.

12. The method of claim 1, wherein the metal vapor is generated by thermally vaporizing a metal source.

* * * * *